United States Patent
Ikeda et al.

(10) Patent No.: US 7,825,008 B2
(45) Date of Patent: Nov. 2, 2010

(54) METHOD OF FABRICATING LIGHT EMITTING DEVICE AND THUS-FABRICATED LIGHT EMITTING DEVICE

(75) Inventors: Hitoshi Ikeda, Annaka (JP); Akio Nakamura, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 98 days.

(21) Appl. No.: 11/712,940

(22) Filed: Mar. 2, 2007

(65) Prior Publication Data

US 2007/0210327 A1  Sep. 13, 2007

(30) Foreign Application Priority Data

Mar. 7, 2006  (JP) .............................. 2006-061463

(51) Int. Cl.
*H01L 21/46* (2006.01)
(52) U.S. Cl. .................... 438/460; 438/458; 438/462
(58) Field of Classification Search ................ 438/745, 438/460, 462, 464, 800; 257/79, 98, 100, 257/466, 436, 447, 460
See application file for complete search history.

(56) References Cited

U.S. PATENT DOCUMENTS

| | | | | |
|---|---|---|---|---|
| 4,610,079 | A * | 9/1986 | Abe et al. ..................... | 438/462 |
| 6,753,587 | B2 * | 6/2004 | Furuya et al. ................ | 257/466 |
| 6,791,117 | B2 | 9/2004 | Yoshitake | |
| 6,897,126 | B2 * | 5/2005 | Asano et al. ................. | 438/460 |
| 6,924,210 | B1 * | 8/2005 | Daubenspeck et al. ...... | 438/460 |
| 6,924,513 | B2 * | 8/2005 | Akaike et al. ................ | 257/98 |
| 6,995,401 | B2 * | 2/2006 | Yamada et al. ............... | 257/79 |
| 7,037,738 | B2 | 5/2006 | Sugiyama | |
| 7,183,137 | B2 * | 2/2007 | Lee et al. ..................... | 438/114 |
| 2003/0132445 | A1 | 7/2003 | Yoshitake | |
| 2003/0178626 | A1 | 9/2003 | Sugiyama | |
| 2005/0003632 | A1 * | 1/2005 | Onishi et al. ................. | 438/462 |
| 2007/0007543 | A1 * | 1/2007 | Kametani et al. ............ | 257/98 |
| 2007/0210327 | A1 * | 9/2007 | Ikeda et al. .................. | 257/103 |

FOREIGN PATENT DOCUMENTS

| | | |
|---|---|---|
| JP | 8-115893 | 5/1996 |
| JP | 2003-209283 | 7/2003 |
| JP | 2003-218383 | 7/2003 |
| JP | 2005-317664 | 11/2005 |

\* cited by examiner

*Primary Examiner*—Steven Loke
*Assistant Examiner*—David Goodwin
(74) *Attorney, Agent, or Firm*—Oliff & Berridge, PLC

(57) ABSTRACT

Aiming at providing a method of fabricating a light emitting device having an AlGaInP light emitting section, less causative of crack by cleavage, on the edge portions on the back surface of the device chip in process of dicing or breaking, a light emitting device wafer is diced along a dicing line inclined at an angle of 15° to 30°, both ends inclusive, away from a dicing line angle reference direction defined as the <110> direction on the (100) main surface.

5 Claims, 8 Drawing Sheets

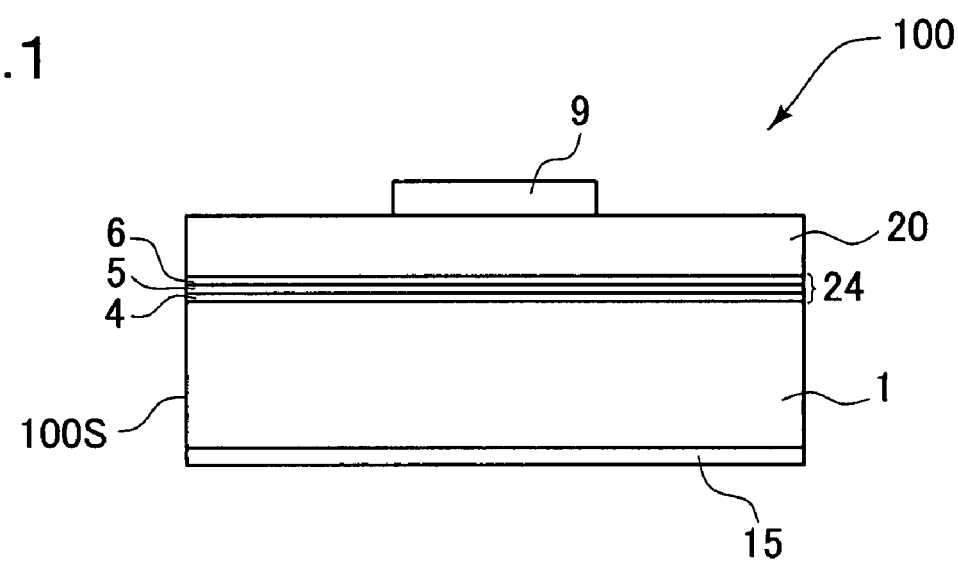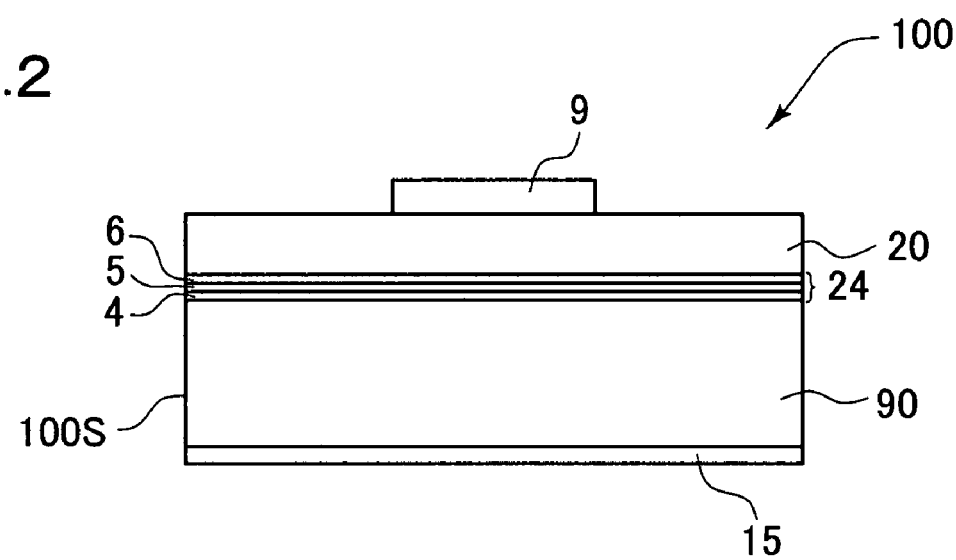

FIG.3
STEP 1
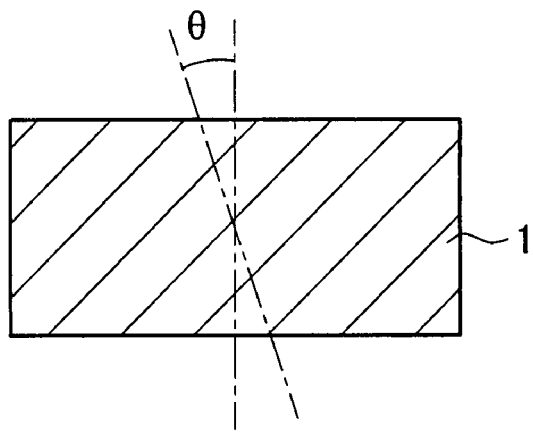
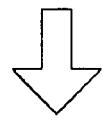
STEP 2
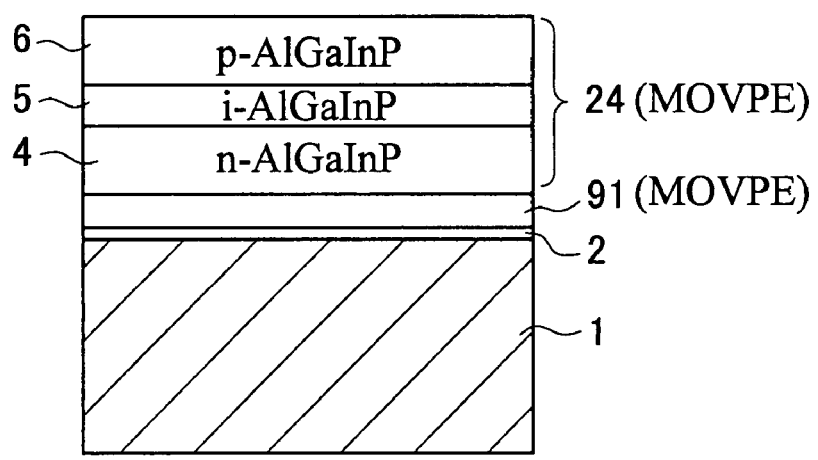

FIG.4
STEP 3
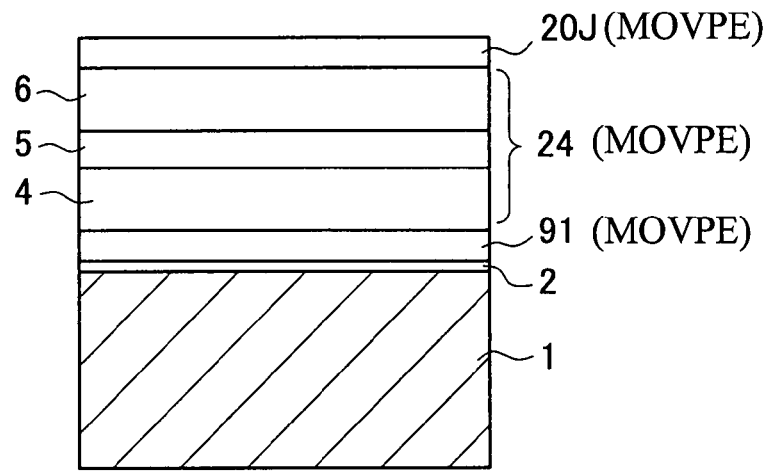
STEP 4
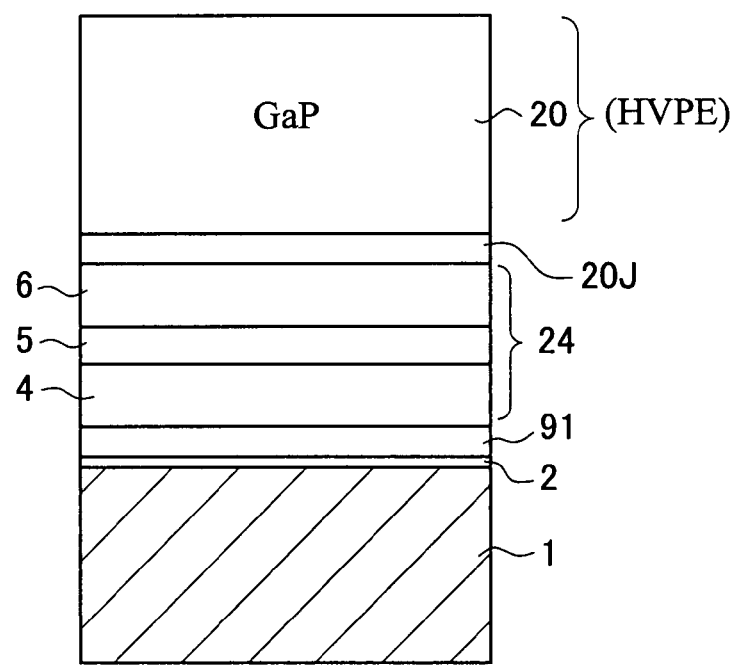

FIG.5
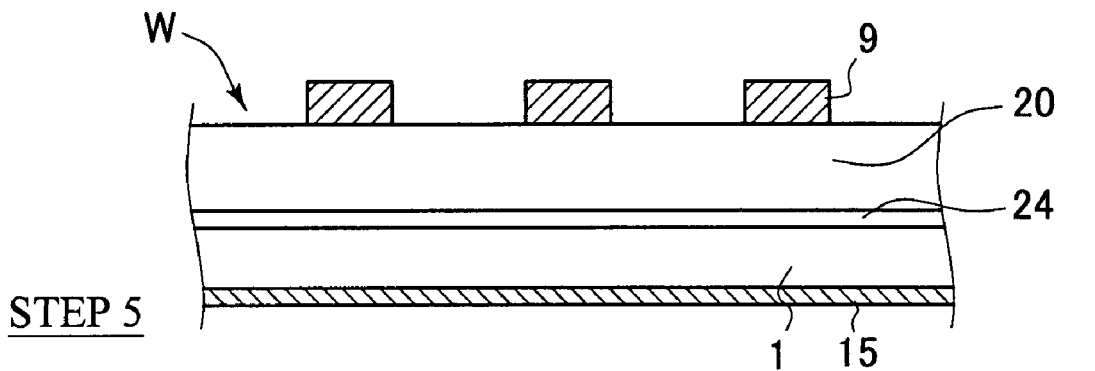
STEP 5
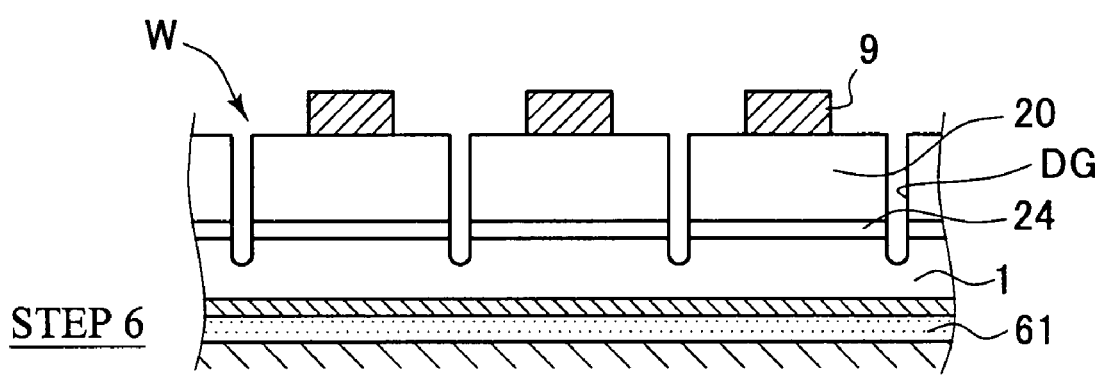
STEP 6
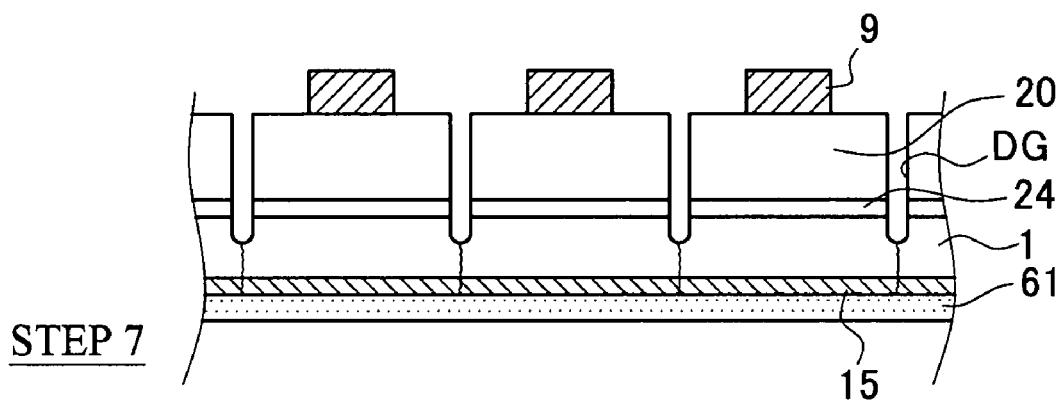
STEP 7

FIG.7
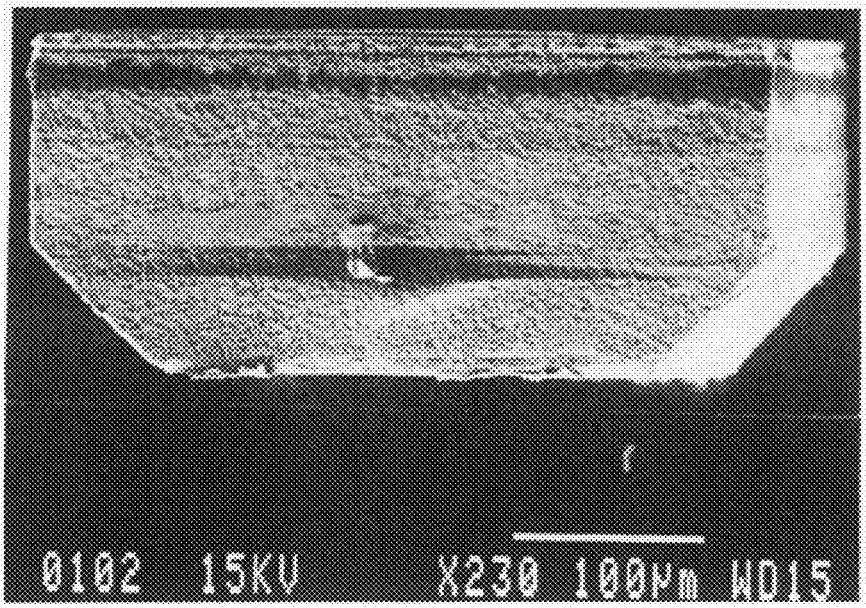
FIG.8
| COMPARATIVE EXAMPLE 1 (0°) | EXAMPLE (22.5°) | COMPARATIVE EXAMPLE 2 (45°) |
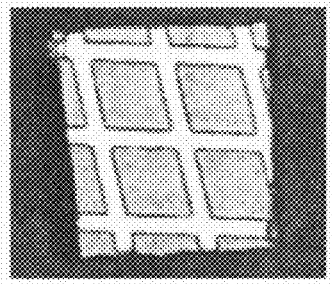 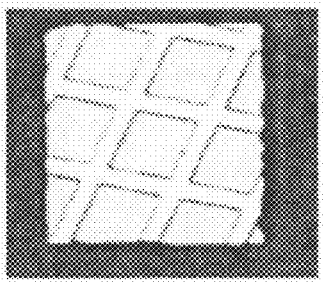 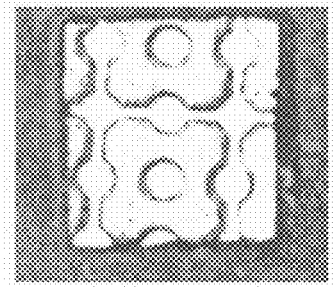
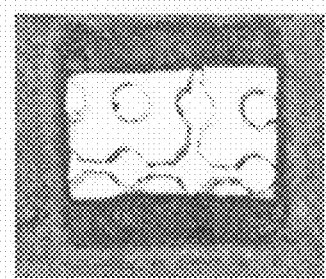

METHOD OF FABRICATING LIGHT EMITTING DEVICE AND THUS-FABRICATED LIGHT EMITTING DEVICE

RELATED APPLICATIONS

This application claims the priority of Japanese Patent Application No. 2006-061463 filed on Mar. 7, 2006, which is incorporated herein by reference.

BACKGROUND OF THE INVENTION

1. Field of the Invention

This invention relates to a method of fabricating a light emitting device and thus-fabricated light emitting device.

2. Description of the Related Art

Related arts are disclosed in:

(Patent Document 1) Japanese Laid-Open Patent Publication No. 2003-218383;

(Patent Document 2) Japanese Laid-Open Patent Publication No. 2003-209283;

(Patent Document 3) Japanese Laid-Open Patent Publication No. H8-115893; and (Patent Document 4) Japanese Laid-Open Patent Publication No. 2005-317664.

Light emitting device having a light emitting layer section typically composed of an $(Al_xGa_{1-x})_yIn_{1-y}P$ alloy (where, $0 \leq x \leq 1$, $0 \leq y \leq 1$; referred to as AlGaInP alloy, or more simply AlGaInP, hereinafter) is fabricated by allowing the light emitting layer section to epitaxially grow on a GaAs single crystal substrate. The GaAs single crystal substrate is directly put into use as a device substrate portion. On the other hand, there is another practice of removing the GaAs substrate, which is a light-absorbing substrate (or opaque substrate), by grinding, etching or the like after the light emitting layer section was grown thereon, and instead forming a transparent GaP single crystal layer by bonding or vapor phase growth (any substrate fabricated by any method will be referred to as "GaP single crystal substrate" in a broad sense in this patent specification).

By the way, the device substrate portion composed of a III-V compound semiconductor such as GaAs and GaP has a cleavage plane along the {110} surface, so that it has been supposed that, if the side faces of chips produced by dicing agree with the {110} surface (where, deviation within the range from 1° to 25°, both ends inclusive, away from the exact {110} surface is allowable, given that the device substrate is an off-axis substrate), individualization into chips can be more simplified, by combining half-dicing of the wafer and breaking based on cleavage. Even for the case of adopting full-cut dicing of the wafer in order to produce the chips, the dicing surface agreed with the cleavage plane can reduce load of dicing, and can make chipping less likely to occur. Aiming at full exhibition of the above-described advantages, it has been a fixed idea for III-V compound semiconductor devices having the zincblende crystal structure, but not limited to the light emitting device within a scope of this invention, to align the direction of dicing with the <110> direction when they are manufactured by dicing wafers having the (100) main surface (also simply referred to as (100) wafer, hereinafter). For example, Patent Document 3 discloses a method of fabricating a light emitting device, involving dicing of a (100) wafer parallel to the orientation flat, wherein the orientation flat of the (100) wafer is generally formed parallel to the {110} surface, so that the dicing direction described in Patent Document 3 lies in the <110> direction.

However, investigations by the present inventors made clear that a device chip having the {110} surface on the side faces 100'S thereof, as shown in FIG. 10, tends to have a large number of crystal defects formed therein in parallel with the side faces of the constituent layers, because the crystal defects such as dislocation, ascribable to mechanical processing, tend to occur along the cleavage plane, and this may adversely affect fabrication of the device against expectation. More specifically, the dicing along the {110} surface composing the cleavage plane (that is, dicing carried out on the {100} surface composing the main surface of the wafer, in the direction targeted at the <110> direction) tends to produce a large crack CK by cleavage along the {111} surface, on the edge portion of the back surface of the device substrate portion (that is, on the opposite side of the light extraction surface having an electrode 9 formed thereon) which acts as a fixation surface during the dicing (the cleavage plane causing the crack is 35 to 36° away from the main surface of the device chip).

In order to solve this problem, the present inventors proposed to dice the wafer so as to make the {100} surface expose to the side faces 100'S as shown in FIG. 11, that is, to dice the wafer in the direction targeted at the <100> direction on the {100} surface composing the main surface of the wafer (Patent Document 4). In this case, the side faces of the device chip incline 45° away from the {110} surface composing the cleavage plane. Further detailed investigation by the present inventors, however, revealed that also this case similarly tends to produce a large crack CK as shown in FIG. 11 (the cleavage plane causing the crack inclined 45° away from the main surface of the device chip). This sort of crack is more likely to occur when a process step of obtaining the device chips by half-dicing of the wafer and succeeding breaking is adopted.

It is therefore a subject of this invention to provide a method of fabricating a light emitting device having an AlGaInP light emitting layer section, less likely to cause crack by cleavage on the edge portion of the back surface of the device chip, during dicing or breaking, and a light emitting device obtained by this method.

SUMMARY OF THE INVENTION

Aiming at solving the above-described subject, a method of fabricating a light emitting device according to this invention is such as obtaining light emitting device chips by dicing a light emitting device wafer, the wafer having a light emitting layer section composed of a compound semiconductor having a composition allowing lattice matching with GaAs, out of compound semiconductors expressed by formula $(Al_xGa_{1-x})_yIn_{1-y}P$ (where, $0 \leq x \leq 1$, $0 \leq y \leq 1$), with the (100) surface appeared on the main surface thereof; and a device substrate portion stacked on the light emitting layer section as being agreed therewith in the crystal orientation, and composed of a III-V compound semiconductor, along a dicing line inclined at an angle of 15° to 30°, both ends inclusive, away from a dicing line angle reference direction defined as the <110> direction on the main surface.

A light emitting device of this invention is such as having a light emitting layer section composed of a compound semiconductor having a composition allowing lattice matching with GaAs, out of compound semiconductors expressed by formula $(Al_xGa_{1-x})_yIn_{1-y}P$ (where, $0 \leq x \leq 1$, $0 \leq y \leq 1$), with the (100) surface appeared on the main surface thereof; and a device substrate portion stacked on the light emitting layer section as being agreed therewith in the crystal orientation, and composed of a III-V compound semiconductor, wherein the side faces of the device are composed of dicing surfaces inclined, with respect to a reference surface defined as the {110} surface, at an angle of 15° to 30°, both ends inclusive, around the axial line normal to the main surface.

"A compound semiconductor allowing lattice matching with GaAs" in this invention means a compound semiconductor having a ratio of lattice mismatching expressed by $\{|a1-a0|/a0\} \times 100$ (%) fallen within a 1% range, where a1 is a lattice constant of the compound semiconductor expected for the bulk crystal state having no stress-induced lattice displacement produced therein, and a0 is a lattice constant of GaAs in the same state. "A compound semiconductor having a composition allowing lattice matching with GaAs, out of compound semiconductors expressed by formula $(Al_xGa_{1-x})_yIn_{1-y}P$ (where, $0 \leq x' \leq 1, 0 \leq y' \leq 1$)" will be referred typically to as "AlGaInP lattice-matched to GaAs". The active layer may be configured as a single AlGaInP layer, or as a quantum well layer having barrier layers and well layers, differed in the AlGaInP composition from each other, alternately stacked therein (quantum well layer as a whole is considered as a single active layer).

It is also to be understood that, for the case where any preferable surfaces adopted herein are expressed by the Miller index {hkl}, also surfaces inclined within the range from 1° to 25°, both ends inclusive, away from the exact {hkl} surface are considered as being included in the concept of the surface expressed by such index, unless otherwise any excessive disadvantages against achievement of the effects of this invention should arise.

It was found that thus-configured light emitting device wafer was likely to cause a large crack by cleavage along the edge portion of the back surface of the chip, in both cases where the dicing was carried out so as to expose the {110} surface to the side faces, and where the dicing was carried out so as to expose the {100} surface, inclined 45° away from the {110} surface, to the side faces. The present inventors, as shown in FIG. 6, however, found out after extensive investigations that incidence of such large crack can dramatically be reduced, by dicing the wafer in the direction which falls in intermediate angular zones between the above-described angles, that is, by dicing along dicing lines inclined at an angle of 15° to 30°, both ends inclusive, away from a dicing line angle reference direction defined as the <110> direction on the (100) main surface (hatched zones in the drawing), and completed this invention. In this case, the side faces of the resultant light emitting device appear as dicing surfaces inclined, with respect to the reference surface defined as the {110} surface, at an angle of 15° to 30°, both ends inclusive, around the axial line normal to the main surface.

Dicing out of the above-described angular range is likely to increase incidence of a large crack by cleavage on the edge portion on the back surface side of the chip. The dicing line is set preferably at an angle of 20° to 28°, both ends inclusive, and more preferably 21° to 24°, both ends inclusive, away from the dicing line angle reference direction. In this case, the side faces of the resultant light emitting device inclines, with respect to a reference surface, at an angle of 20° to 28°, and more preferably 21° to 24°, both ends inclusive, around the axial line normal to the main surface.

The device substrate portion may be composed of a GaAs single crystal substrate. Use of the GaAs single crystal substrate, allowing the light emitting layer section to grow thereon as the device substrate portion can reduce the number of process steps of fabricating the light emitting device. The device substrate may also be composed of a GaP single crystal substrate. This structure can be obtained by removing the GaAs single crystal substrate used for growth of the light emitting layer section, and instead by allowing GaP single crystal to epitaxially grow on the light emitting layer section, or by bonding thereon the GaP single crystal substrate. By removing the light-absorbing GaAs single crystal substrate, and by newly providing the transparent GaP single crystal substrate as the device substrate, light extraction efficiency out from the device substrate can be improved to a large degree (also light reflected on the back surface of the device substrate contributes to improvement in the light extraction efficiency).

The light-emitting device chip can be fabricated by full-dicing the light emitting device wafer from the main surface side opposite to the side having the device substrate portion disposed thereon, but may be fabricated also by half-dicing the device substrate portion halfway along the thickness-wise direction thereof, and then by breaking the half-diced wafer along the dicing grooves. More distinct effect of preventing crack of this invention can be obtained by adopting the latter process in which the crack along the edge of the back surface of the chip tends to occur during the breaking.

BRIEF DESCRIPTION OF THE DRAWINGS

FIG. 1 is a schematic drawing showing a sectional side elevation of a first example of a light emitting device of this invention;

FIG. 2 is a schematic drawing showing a sectional side elevation of a second example of a light emitting device of this invention;

FIG. 3 is a drawing explaining process steps of a method of fabricating the light emitting device shown in FIG. 1;

FIG. 4 is a drawing explaining process steps as continued from FIG. 3;

FIG. 5 is a drawing explaining process steps as continued from FIG. 4;

FIG. 7 is an image observed under a scanning electron microscope, showing a state of occurrence of crack on the back surface of a chip in a comparative example;

FIG. 8 is an image observed under a scanning electron microscope, showing the back surface of a diced chip obtained in an experiment for confirming the effects of this invention;

BEST MODES FOR CARRYING OUT THE INVENTION

Figure 6:
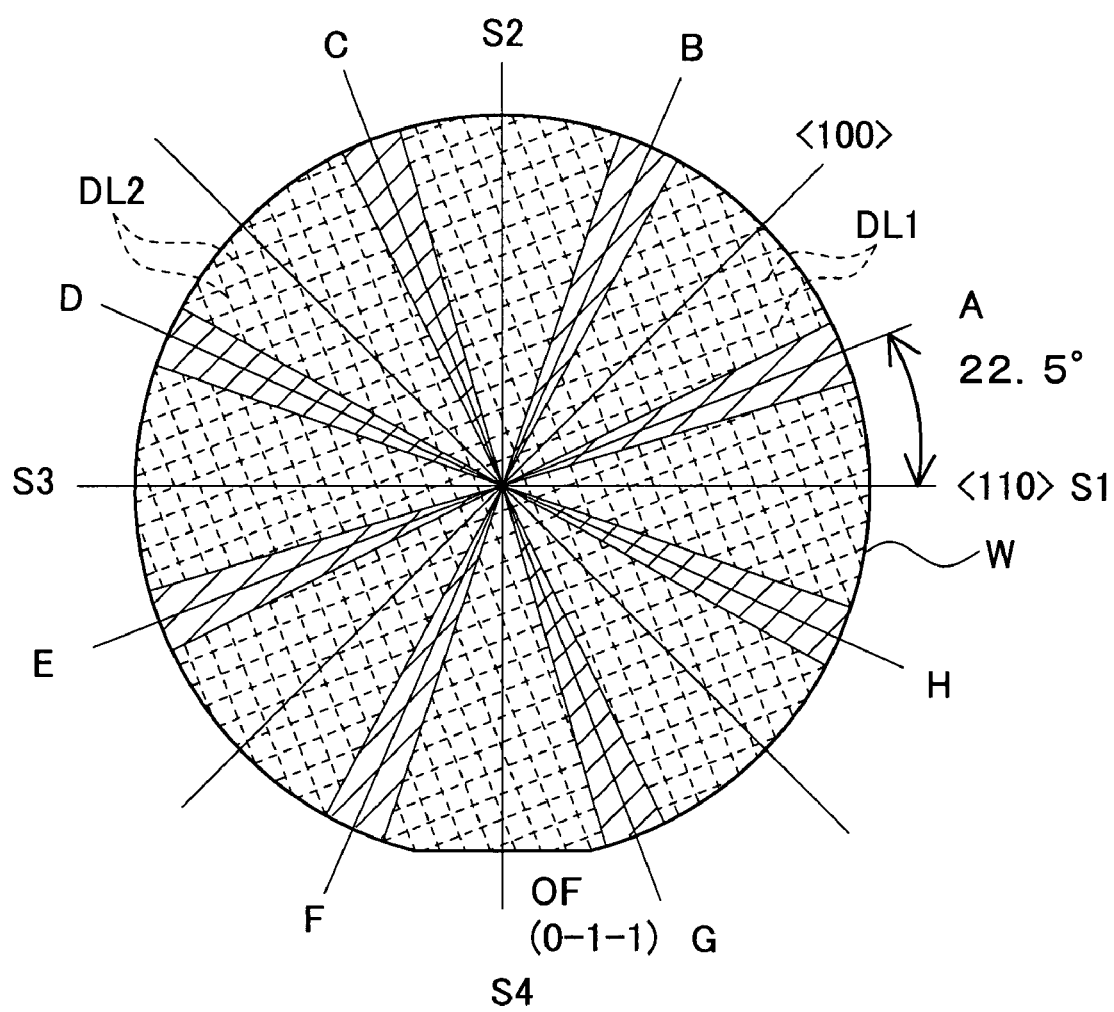
FIG. 6 is a schematic drawing showing an exemplary setting mode of the dicing lines in this invention.

Paragraphs below will describe embodiments of this invention referring to the attached drawings.

FIG. 1 is a conceptual drawing of a light emitting device 100 as one embodiment of this invention. The light emitting device 100 has a light emitting layer section 24 composed of a III-V compound semiconductor, and a GaP light extraction layer (p-type herein) 20 formed on a first main surface side of the light emitting layer section 24. On a second main surface side of the light emitting layer section 24, an n-type GaAs single crystal substrate 1 as a device substrate is disposed. In this embodiment, a chip of the light emitting device 100 has a plain geometry of 400-μm square.

The light emitting layer section 24 has a structure in which an active layer 5 composed of a non-doped $(Al_xGa_{1-x})_yIn_{1-y}P$ alloy (where, $0 \leq x \leq 0.55$, $0.45 \leq y \leq 0.55$) is held between a p-type cladding layer (first-conductivity-type cladding layer) 6 composed of a p-type $(Al_zGa_{1-z})_yIn_{1-y}P$ alloy (where, $x<z\leq 1$), and an n-type cladding layer (second-conductivity-type cladding layer) 4 composed of an n-type $(Al_zGa_{1-z})_yIn_{1-y}P$ alloy (where, $x<z\leq 1$). The light emitting device 100 shown in FIG. 1 has the p-type AlGaInP cladding layer 6 disposed on the first main surface side (upper side in the drawing), and has the n-type AlGaInP cladding layer 4 disposed on the second main surface side (lower side in the drawing). It is to be noted that "non-doped" in the context herein means "not intentionally added with a dopant", without excluding any possibilities of containment of dopant components inevitably included in a normal fabrication process (up to $1\times 10^{13}$ to $1\times 10^{16}/cm^3$ or around, for example). The light emitting layer section 24 is grown by MOVPE method. Thickness of each of the n-type cladding layer 4 and the p-type cladding layer 6 is typically 0.8 μm to 4 μm (more preferably 0.8 μm to 2 μm), both ends inclusive, and thickness of the active layer 5 is typically 0.4 μm to 2 μm (more preferably 0.4 μm to 1 μm), both ends inclusive. Total thickness of the light emitting layer section 24 as a whole is typically 2 μm to 10 μm (more preferably 2 μm to 5 μm), both ends inclusive.

Next, the GaP light extraction layer 20 is formed to as thick as 10 μm to 200 μm (more preferably 40 μm to 200 μm: typically 100 μm in this embodiment), both ends inclusive, and has a light-extraction-area-side metal electrode 9 formed so as to cover a part (center portion herein) of the first main surface thereof, as shown in FIG. 2. The GaP light extraction layer 20 formed to as thick as described in the above allows emission drive current, based on current supply through the light-extraction-area-side metal electrode 9, to spread in-plane over the device, thereby functioning as a current spreading layer assisting in-plane uniform emission of the light emitting layer section 24, and also takes part in increasing flux of light extractable from the side faces of the layer, thereby functioning as raising the luminance (integrating sphere luminance) of the light emitting device as a whole. GaP has a band gap energy larger than that of AlGaInP composing the active layer 5, and is desirably suppressed in absorption of the emitted flux.

The GaP light extraction layer 20 in this embodiment is grown by HVPE method (MOVPE method also allowable). Between the GaP light extraction layer 20 and the light emitting layer section 24, a connection layer 20J (FIG. 4) composed of a GaP layer is formed by the MOVPE method, as being continued from the light emitting layer section 24. The connection layer 20J herein may be composed of an AlGaInP layer capable of gradually varying difference in the lattice constants (and consequently the alloy composition ratio) between the light emitting layer section 24 composed of AlGaInP and the GaP light extraction layer 20. The GaP light extraction layer 20 may also be formed by bonding of a GaP single crystal substrate having a crystal orientation aligned with that of the light emitting layer section 24, in place of being formed as an epitaxially-grown layer by the HVPE method.

The GaAs single crystal substrate 1 is diverted from a substrate portion used for crystal growth of the light emitting layer section 24 and the GaP light extraction layer 20. It is, however, also allowable to once remove the GaAs single crystal substrate 1 by etching or polishing before the light emitting device wafer is diced, and instead, as shown in FIG. 2, to provide the GaP single crystal substrate 90 as the device substrate portion. The GaP single crystal substrate 90 may be formed by bonding a single crystal substrate sliced out from a bulk-grown single crystal ingot, or by growing an epitaxial layer by the HVPE method.

In both configurations shown in FIGS. 1 and 2, the entire portion of the second main surface of the device substrate portion (GaAs single crystal substrate 1 or GaP single crystal substrate 90) is covered with a back electrode 15 composed of an Au electrode or the like. The thickness of the device substrate portion is typically 10 μm to 200 μm, both ends inclusive. For the case where the GaP single crystal substrate 90 is formed as shown in FIG. 2, the back electrode 15 also serves as a reflection layer for the emitted flux of light coming from the light emitting layer section 24 through the GaP single crystal substrate 90, and contributes to improvement in the light extraction efficiency.

In the light emitting device having the light emitting layer section 24 composed of AlGaInP and the device substrate portion composed of a III-V compound semiconductor, a large crack by cleavage tends to be produced along the edge portion of the back surface side of the chip (that is, on the back electrode 15 side in FIGS. 1 and 2), in both cases where the wafer is diced so as to make the {110} surface appear on the side faces 100S, and so as to make the {100} surface, 45° inclined away from the {110} surface, appear on the side faces 100S. FIG. 7 is an image observed under a scanning electron microscope, showing an actual example of occurrence of crack, when the device substrate portion was composed of the GaAs single crystal substrate 1, and the wafer was diced so as to make the {100} surface appear on the side faces of the device. It is found that a large crack occurs at an angle of 45° or around with respect to the main surface composing the back surface of the chip.

In contrast, in this embodiment, in either of the configurations shown in FIGS. 1 and 2, the side faces 100S of the light emitting device 100 are given as those obtained by dicing the light emitting device wafer W along dicing lines DL inclined at an angle (also referred to as dicing angle, hereinafter) of 15° to 30° (preferably 20° to 28°, and more preferably 21° to 24°), both ends inclusive, away from a dicing line angle reference direction defined as the <110> direction on the main surface. By carrying out the dicing in this way, incidence of the above-described crack can considerably be reduced.

Paragraphs below will describe a method of fabricating the light emitting device 100 shown in FIG. 1.

First as shown in STEP 1 in FIG. 3 an n-type GaAs single crystal substrate 1 (350 μm thick), having an off-angle θ of 1° to 25°, both ends inclusive, (15° in this embodiment) is prepared as a growth-assisting substrate (which serves as the device substrate). Next, as shown in STEP 2, an n-type GaAs buffer layer 2 of typically 0.5 μm thick is epitaxially grown on the main surface of the substrate 1, and further thereon, as the light emitting layer section 24, the n-type cladding layer 4 of 1 μm thick (n-type dopant is Si), the active layer (non-doped) 5 of 0.6 μm thick, and the p-type cladding layer 6 of 1 μm thick (p-type dopant is Mg: also C derived from organo-metallic molecules can be contributive as the p-type dopant), respectively composed of an $(Al_xGa_{1-x})_yIn_{1-y}P$ alloy, are epitaxially grown in this order (a connection layer 91 is formed between the buffer layer 2 and the light emitting layer section 24, when the GaP single crystal substrate 90 is provided as the device substrate). Further on the p-type cladding layer 6, the connection layer 20J is epitaxially grown, as shown in STEP 3 in FIG. 4.

The above-described individual layers are epitaxially grown by any publicly-known MOVPE method. Source gases available as supply sources of the individual components Al, Ga, In (indium) and P (phosphorus) include the followings:

Al source gas: trimethyl aluminum (TMAl), triethyl aluminum (TEAl), etc.;
Ga source gas: trimethyl gallium (TMGa), triethyl gallium (TEGa), etc.;
In source gas: trimethyl indium (TMIn), triethyl indium (TEIn), etc.; and
P source gas: trimethyl phosphorus (TMP), triethyl phosphorus (TEP), phosphine ($PH_3$), etc.

The process then advances to STEP 4 in FIG. 4, wherein the GaP light extraction layer 20 (100 μm thick, in this embodiment) composed of p-type GaP is epitaxially grown by the HVPE method. The HVPE method is specifically proceeded so that Ga as a Group III element is heated and kept at a predetermined temperature in a vessel, hydrogen chloride is introduced over Ga to thereby produce GaCl through a reaction expressed by the formula (1) below, and GaCl is then supplied over the substrate together with $H_2$ gas as a carrier gas:

$$Ga(l) + HCl(g) \rightarrow GaCl(g) + \tfrac{1}{2}H_2 \quad (1)$$

The growth temperature is typically set to 640° C. to 860° C., both ends inclusive, wherein P as a Group V element is supplied in a form of $PH_3$, together with $H_2$ as a carrier gas. Zn as a p-type dopant is supplied in a form of DMZn (dimethyl Zn) GaCl is excellent in reactivity with $PH_3$, and can efficiently grow the GaP light extraction layer 20 according to the reaction expressed by the formula (2) below:

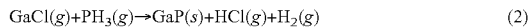

$$GaCl(g) + PH_3(g) \rightarrow GaP(s) + HCl(g) + H_2(g) \quad (2)$$

For the case where the light emitting device shown in FIG. 2 is fabricated, the process is further followed by removal of the GaAs single crystal substrate 1 by chemical etching using an etching solution such as an ammonia/hydrogen peroxide mixed solution. An n-type GaP single crystal substrate prepared elsewhere is then bonded to the second main surface side of the light emitting layer section 24 (second main surface of the connection layer 91) exposed after removal of the GaAs substrate 1, or the GaP single crystal substrate 90 is formed thereon by epitaxial growth based on the HVPE method.

After completion of these steps, the process advances to STEP 5 in FIG. 5, wherein the light-extraction-area-side metal electrode 9 and the back electrode 15 are formed respectively on the first main surface of the GaP light extraction layer 20 and the second main surface of the GaAs single crystal substrate 1, by sputtering or vacuum evaporation, and thereby the light emitting device wafer W (with an orientation flat OF showing the (0-1-1) surface previously formed therein) is formed. The light emitting device wafer W is then diced, as shown in STEP 6, from the main surface opposite to the side having the GaAs single crystal substrate (device substrate portion) 1 disposed thereon (that is, from the side having the light-extraction-area-side electrode 9 formed thereon). The light emitting device wafer W is adhered on the back surface side thereof to an adhesive sheet 61, and is diced, while keeping this state, halfway along the thickness-wise direction of the device substrate portion 1 from the light-extraction-area-side electrode 9 side. For the wafer W after being half-diced, breaking can be carried out along dicing grooves DG as shown in STEP 7, when applied with bending deformation making use of flexibility of the adhesive sheet 61.

As is clear from FIG. 6, there are four <110> directions (S1, S2, S3, S4) on the wafer W having the (100) main surface, and any of these may be used as the dicing line angle reference direction. In this case, setting zones of the dicing lines DL satisfying the above-described range of dicing angle reside in both of forward- and reverse-rotating directions for each of the dicing line angle reference directions S1, S2, S3, S4, that is, eight zones in total. The reference dicing line (any one of A to H: represented by A in the drawing) is located in any one of eight these zones, and a set of the residual dicing lines is located in parallel therewith. Because the plain geometry of the device chip is square, the wafer is diced along another set of dicing lines DL2 normal to the set of dicing lines DL1.

Paragraphs below will explain results of experiment conducted in order to confirm the effects of this invention.

Figure 9:
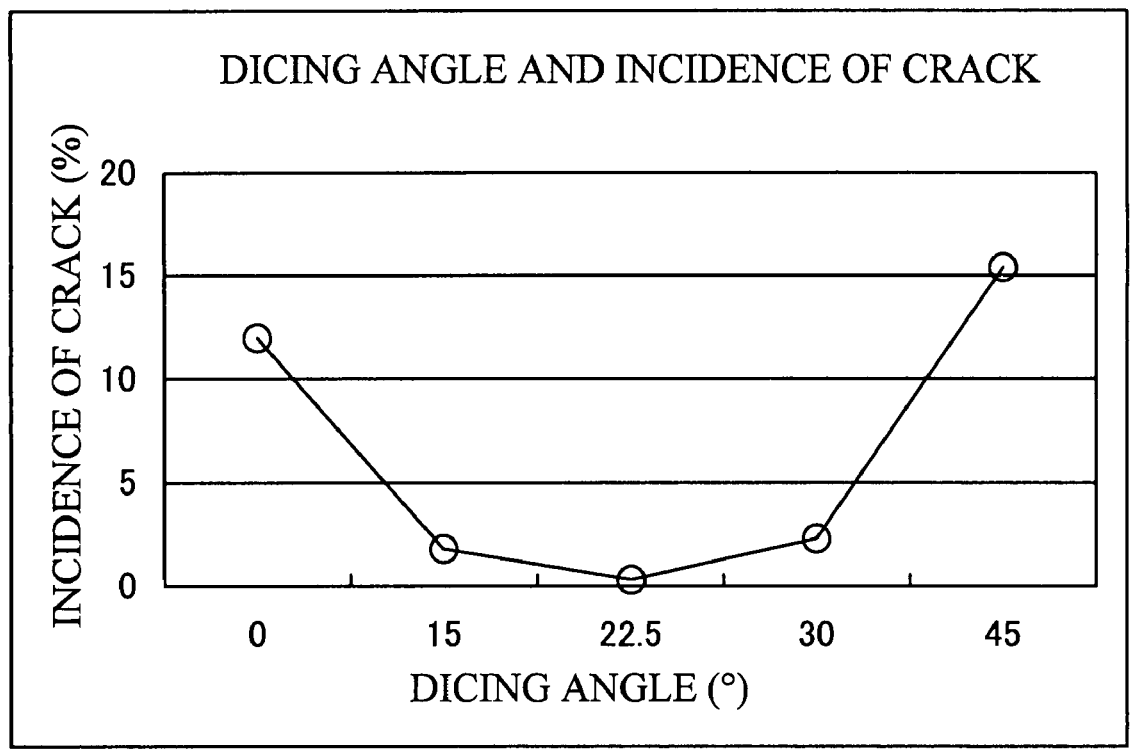
FIG. 9 is a graph showing relations between dicing angle and incidence of crack, obtained in an experiment for confirming the effects of this invention.
Figure 10:
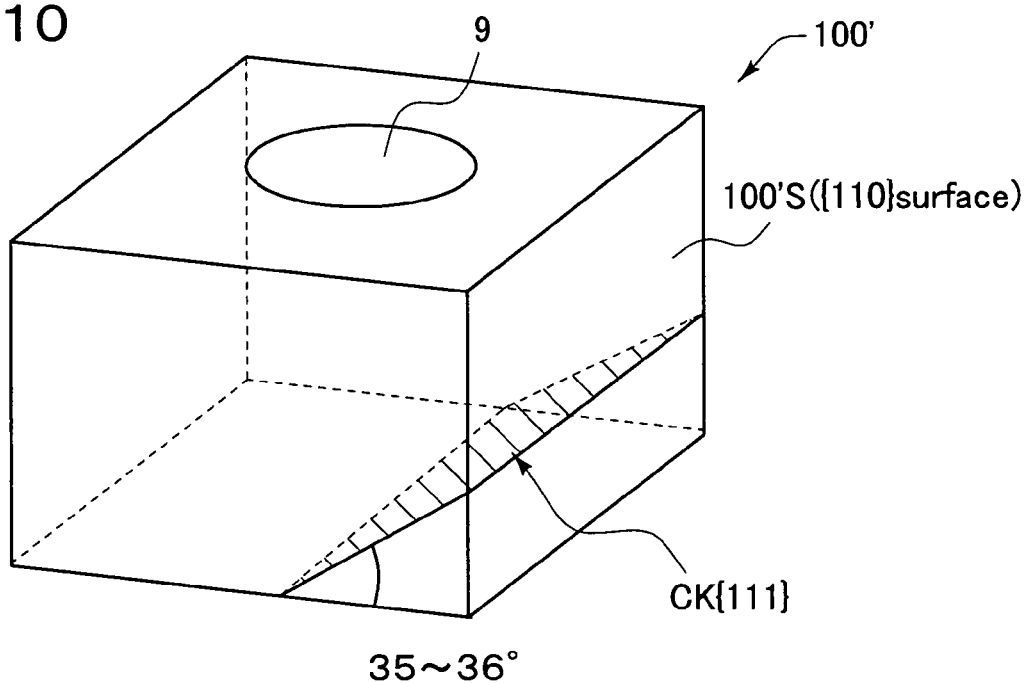
FIG. 10 is a first schematic drawing showing a state of occurrence of crack on the back surface of a chip in the prior art.
Figure 11:
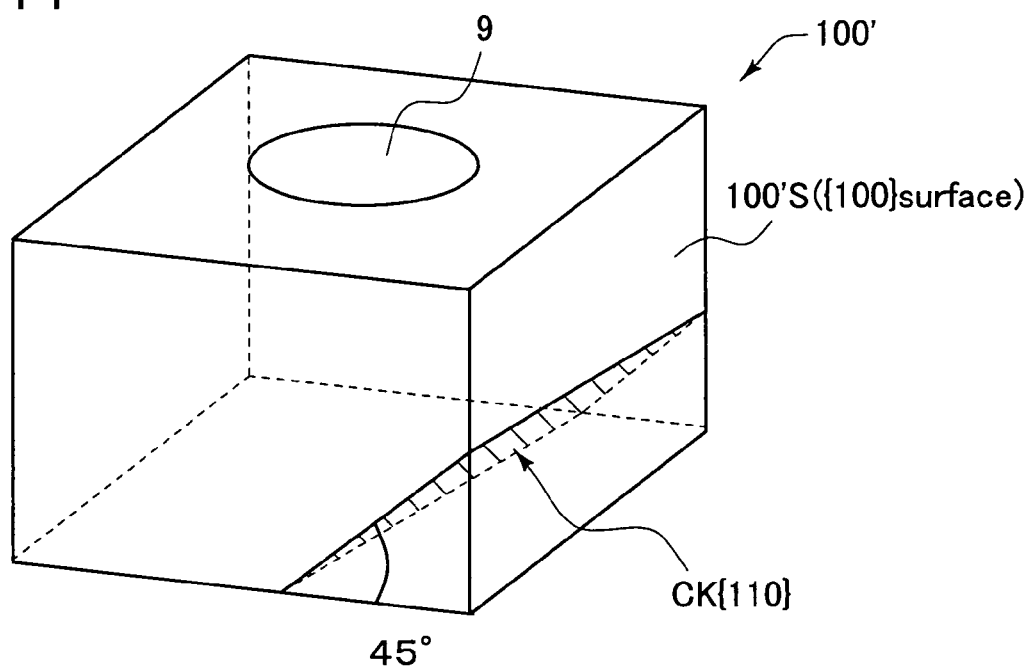
FIG. 11 is a second schematic drawing of the same.

The light emitting device wafer W (50 mm in diameter) was fabricated by the process previously explained referring to FIGS. 3 and 4. The light emitting device wafer was then diced according to the steps shown in FIG. 5. The dicing angle was set to various values within the range from 0° to 45°. After the dicing, state of occurrence of crack on the back surface of the chips was confirmed under a magnifying glass, and incidence of crack relative to the total number of chips was obtained. Results are shown in Table 1 and FIG. 9. FIG. 8 additionally shows observed images of the back electrode side of the device chips, obtained under dicing angles of 0° (comparative example), 22.5° (example) and 45° (comparative example).

TABLE 1

| | Dicing angle (°) | | | | |
|---|---|---|---|---|---|
| | 0 | 15 | 22.5 | 30 | 45 |
| Incidence of crack (%) | 12 | 1.8 | 0.3 | 2.3 | 15.4 |

It was found from the results that incidence of crack decreased to a large degree within a range of dicing angle of 15° to 30°, both ends inclusive. Almost no crack was found in particular for a dicing angle of 22.5° (21° to 24°, both ends inclusive).

What is claimed is:

1. A method of fabricating a light emitting device to obtain square-shaped light emitting device chips, the method comprising:
   dicing a light emitting device wafer along a dicing line inclined at an angle of 21° to 24°, both ends inclusive, away from a dicing line angle reference direction defined as the <110> direction on the (100) surface, to thereby obtain the square-shaped light emitting device chips,
   the light emitting device wafer having a light emitting layer section composed of a compound semiconductor having a composition expressed by formula $(Al_xGa_{1-x})_yIn_{1-y}P$ (where, $0 \leq x \leq 1$, $0 \leq y \leq 1$), the compound semiconductor capable of lattice matching with GaAs, and the light emitting device wafer having a (100) surface on a main surface thereof; and a device substrate portion stacked on the light emitting layer section and having a crystal orientation aligned with that of the light emitting layer section, and the device substrate portion composed of a III-V compound semiconductor.

2. The method of fabricating a light emitting device as claimed in claim 1, wherein the light emitting device chips are obtained by half-dicing the light emitting device wafer halfway along a thickness-wise direction thereof, from a side along the main surface, to thereby form half-dicing grooves, and then breaking the half-diced light emitting device wafer along each of the half-dicing grooves.

3. The method of fabricating a light emitting device as claimed in claim 1, wherein the device substrate portion is a GaAs single crystal substrate.

4. The method of fabricating a light emitting device as claimed in claim 1, wherein the device substrate portion is a GaP single crystal substrate.

5. The method of fabricating a light emitting device as claimed in claim 1, wherein the dicing line is set at an angle of 22.5° away from the dicing line angle reference direction.

* * * * *